United States Patent [19]
Ikeda

[11] Patent Number: 5,638,223
[45] Date of Patent: Jun. 10, 1997

[54] PROJECTION TYPE EXPOSURE APPARATUS AND METHOD WITH DETACHABLE AND ATTACHABLE LENS BARREL UNITS

[75] Inventor: Masatoshi Ikeda, Tokyo, Japan

[73] Assignee: Nikon Corporation, Tokyo, Japan

[21] Appl. No.: 553,086

[22] Filed: Nov. 3, 1995

Related U.S. Application Data

[63] Continuation of Ser. No. 302,477, Sep. 12, 1994, abandoned.

[30] Foreign Application Priority Data

Sep. 14, 1993 [JP] Japan ................................. 5-252387

[51] Int. Cl.⁶ .................................................. G02B 07/02
[52] U.S. Cl. ........................... 359/827; 359/821; 359/823
[58] Field of Search ................................. 359/702, 703, 359/704, 827, 828, 821, 822, 823, 826; 353/101

[56] References Cited

U.S. PATENT DOCUMENTS

| | | | |
|---|---|---|---|
| 2,794,360 | 6/1957 | Eagle | 359/828 |
| 4,666,273 | 5/1987 | Shimizu et al. | 353/101 |
| 4,690,528 | 9/1987 | Tanimoto | 353/101 |
| 5,077,569 | 12/1991 | Notagashira | 359/694 |
| 5,117,255 | 5/1992 | Shiraishi et al. | 355/53 |
| 5,500,772 | 3/1996 | Ishii | 359/822 |
| 5,526,194 | 6/1996 | Ruffell | 359/827 |

Primary Examiner—Georgia Y. Epps
Assistant Examiner—Ricky Mack
Attorney, Agent, or Firm—Shapiro and Shapiro

[57] ABSTRACT

A projection type exposure apparatus is provided for illuminating a mask formed with a pattern with an illumination light having a predetermined wavelength area and forming an image of the pattern on a substrate through a projection optical system. This apparatus comprises a projection optical system incorporating a plurality of lens barrel units each housing one or more optical elements. Each lens barrel unit is so mounted in the projection optical system as to be attachable thereto and detachable therefrom.

15 Claims, 6 Drawing Sheets

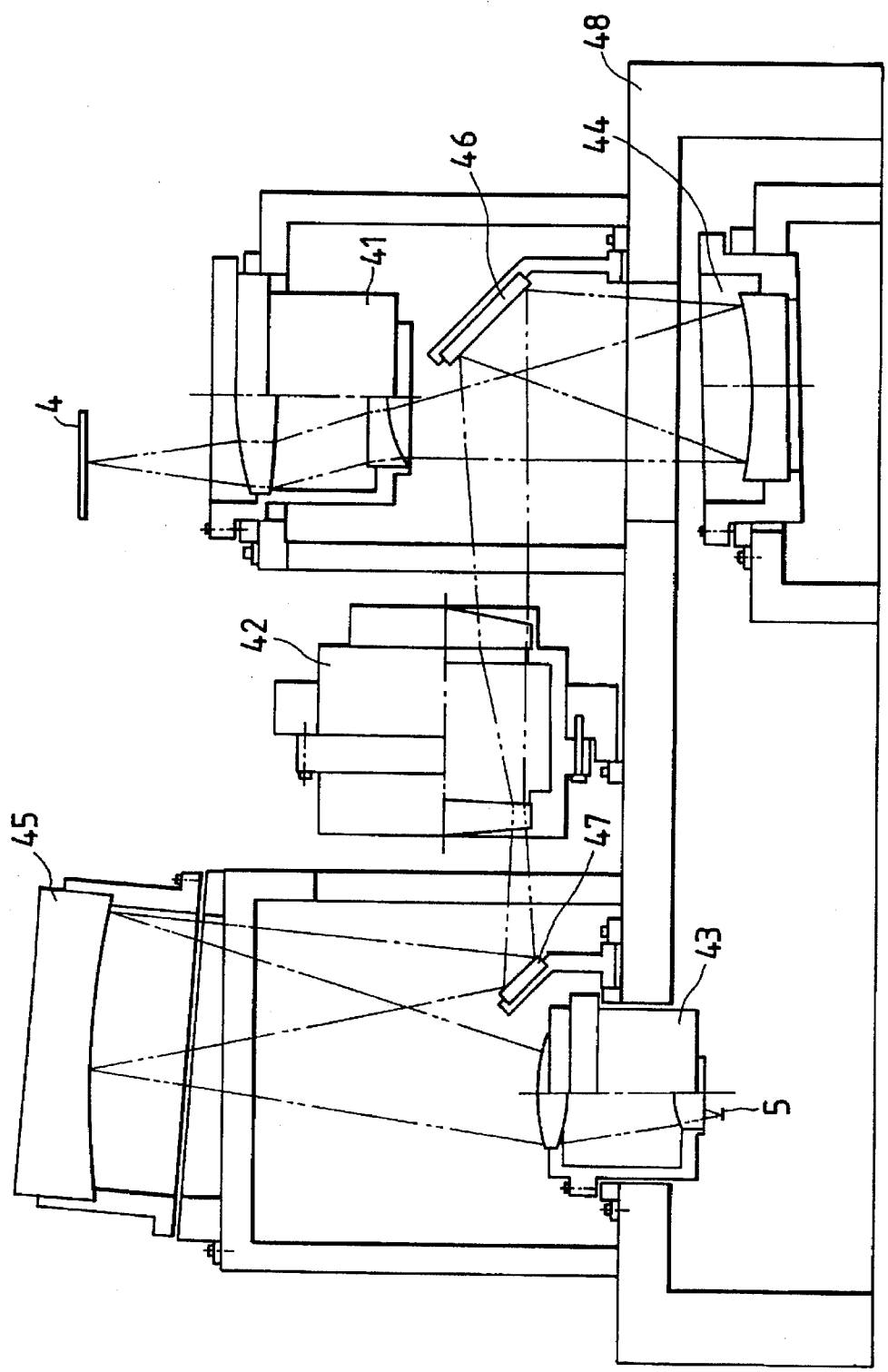

PROJECTION TYPE EXPOSURE APPARATUS AND METHOD WITH DETACHABLE AND ATTACHABLE LENS BARREL UNITS

This is a continuation of application Ser. No. 08/302,477 filed Sep. 12, 1994, now abandoned.

BACKGROUND OF THE INVENTION

1. Field of the Invention

The present invention relates generally to a projection type exposure apparatus and method and, more particularly, to a structure of a lens barrel of a projection optical system.

2. Related Background Art

FIG. 7 illustrates a structure of a lens barrel of a prior art lens projection (refraction) type projection optical system of a projection type exposure apparatus. As shown in FIG. 7, the conventional lens projection type projection optical system transfers a pattern formed on a photo mask 4 like, e.g., a reticle onto a projected substrate 5 such as a wafer. This lens projection type projection optical system has a single lens barrel 1. A bottom of the lens barrel 1 is formed with an opening 6 and a protrusion member 7 protruding inward. An upper portion of the lens barrel 1 is also formed with an opening 8 into which a ring-like holding member 3 is screwed.

Further, the lens barrel 1 incorporates a plurality of lens frames 2 for housing optical elements (lenses) L, respectively. An optical axis of each lens L housed in the lens frame 2 is located to coincide with an optical axis AX of the lens projection type projection optical system.

Thus, the structure of the lens barrel of the prior art lens projection type projection optical system entails such a configuration that the single lens barrel accommodates all the lens frames.

In the case of assembling the prior art lens projection type projection optical system having the above-discussed construction, the individual lens frames 2 housing the lenses L are sequentially inserted down into the interior of the lens barrel 1 via the upper opening 8. The lens frame 2 which has been thus inserted down is supported on the protrusion member 7 formed at the bottom of the lens barrel 1, thus laminating the lens frames 2 in the interior of the lens barrel 1. When housing all the lens frames 2, the holding member 3 is fitted in the opening 8, thus completing the assembly thereof.

Generally, the lens projection type projection optical system needs to make optical adjustments such as an adjustment of a lens-to-lens distance, an adjustment of an inclination (hereinafter termed a [tilt]) to the optical axis AX of each lens and an adjustment of an optical axis eccentricity of each lens with respect to the optical axis AX. In the conventional lens projection type projection optical system having the above-mentioned construction, such optical adjustments are required to be performed after removing the respective lens frames 2 out of the lens barrel 1. The optical adjustments are also required to be effected while seeing a result of image formation through the whole system, and, therefore, the optical adjustment can be carried out only in such a state that the whole construction is accomplished by incorporating all the lens frames 2 in the prior art lens projection type projection optical system.

As described above, in the conventional lens projection type projection optical system, all the optical elements are housed in the single lens barrel, thus constructing one assembly unit. Accordingly, if a certain specified optical element needs the optical adjustment, a removal of this specified optical element out of the lens barrel implies exactly a decomposition of one assembly unit. Further, as explained above, the optical adjustments can be conducted only in the state where the whole optical system is reconstructed by incorporating all the lens frames, and, hence, those operations of the decomposition and the reconstruction (reassembly) are required to be repeated for the optical adjustment of even one lens element. There exists such a drawback that an efficiency of the optical adjustment remarkably worsens with a larger number of constructive lens elements.

Further, a structure of the lens barrel of a mirror-lens projection (catadioptric system) type projection optical system is much more complicated than in the conventional lens projection type projection optical system described above. The mirror-lens projection type projection optical system also has the same drawback inherent in the optical adjustment as that of the conventional lens projection type projection optical system.

SUMMARY OF THE INVENTION

It is a primary object of the present invention, which was devised in view of the problems given above, to provide a projection type exposure apparatus and method capable of making an optical adjustment only a desired optical element unit without influencing other optical element units of a protection optical system.

To obviate the above problems, according to one aspect of the present invention, there is provided a projection type exposure apparatus for illuminating a mask formed with a pattern with an illumination light having a predetermined wavelength area and forming an image of the pattern on a projected substrate through a projection optical system. The projection type exposure apparatus comprises a projection optical system incorporating a plurality of lens barrel units each housing one or more optical elements. Each lens barrel unit is so mounted in the projection optical system as to be attachable thereto and detachable therefrom.

Further, according to a preferred mode of the present invention, each of the lens barrel units has a locating/adjusting mechanism for locating each lens barrel unit in a predetermined position in the projection optical system.

Specifically, the projection optical system is a lens projection (refraction) type projection optical system and preferably has an adjusting mechanism for making at least one adjustment of a shift adjustment of each of the lens barrel units along an optical axis, a tilt adjustment of each of the lens barrel units with respect to the optical axis and an eccentric adjustment of the optical element with respect to the optical axis.

Also, the projection optical system is a lens projection type projection optical system and preferably has an adjusting mechanism for making at least one adjustment of a shift adjustment of each of the lens barrel units along an optical axis, a tilt adjustment of each of the lens barrel units with respect to the optical axis and a locating adjustment of each of the lens barrel units in a direction orthogonal to the optical axis.

As explained above, the lens barrel of the projection optical system in the projection type exposure apparatus of this invention is separated into the plurality of lens barrel units. Each lens barrel unit is constructed to be mounted in the projection optical system in an attachable/detachable manner.

In this way, according to the present invention, each of the lens barrel units is so mounted in the projection optical system as to be attachable thereto and detachable therefrom, and, hence, each lens barrel unit can be freely replaced. By availing this characteristic, for example, an optically-adjusted master is prepared beforehand, and the optical adjustment and the evaluation of the optical characteristic can be effected by replacing each unit with a predetermined master unit corresponding thereto. Then, the projection optical system can be completed by combining accepted units assuring the desired optical characteristics.

Furthermore, the optical characteristic of each unit can be previously evaluated, and, because of a tendency of the optical characteristic of each unit being clarified, the units are combined to supplement or cancel lacks (e.g., higher-order aberrations and eccentric components that Seidel's five aberrations) of the optical characteristics of the individual units. Thus, it is possible to totally satisfy the specification of the whole projection optical system. Speaking specifically of, e.g., an aberration characteristic, if a certain unit has a plus lens distortion, it follows that a unit having a minus lens distortion is selected as another unit connected thereto.

As discussed above, the lens unit of the projection optical system in the projection type exposure apparatus of this invention is separated into the plurality of replaceable lens barrel units, and hence the optical adjustment can be performed per separated unit by making use of, e.g., the master. Accordingly, it is feasible to independently carry out the optical adjustment of a desired unit at a high efficiency without influencing the whole projection optical system or other units. Further, the units are replaceable, and, even when some trouble happens in a certain unit, it is therefore possible to replace this unit with a unit exhibiting the same optical characteristic or a different optical characteristic as the necessity arises.

Also, the optical performance of each unit can be evaluated, and, therefore, the units are combined to cancel the lack of optical performance of each unit, thereby making it possible to construct the projection optical system having the excellent optical performance on the whole.

BRIEF DESCRIPTION OF THE DRAWINGS

Other objects and advantages of the present invention will become apparent during the following discussion in conjunction with the accompanying drawings, in which:

FIG. 4 is a view illustrating more specifically the construction of the mirror-lens projection type projection optical system of FIG. 3;

DESCRIPTION OF THE PREFERRED EMBODIMENTS

Embodiments of the present invention will hereinafter be discussed with reference to the accompanying drawings.

Figure 1:
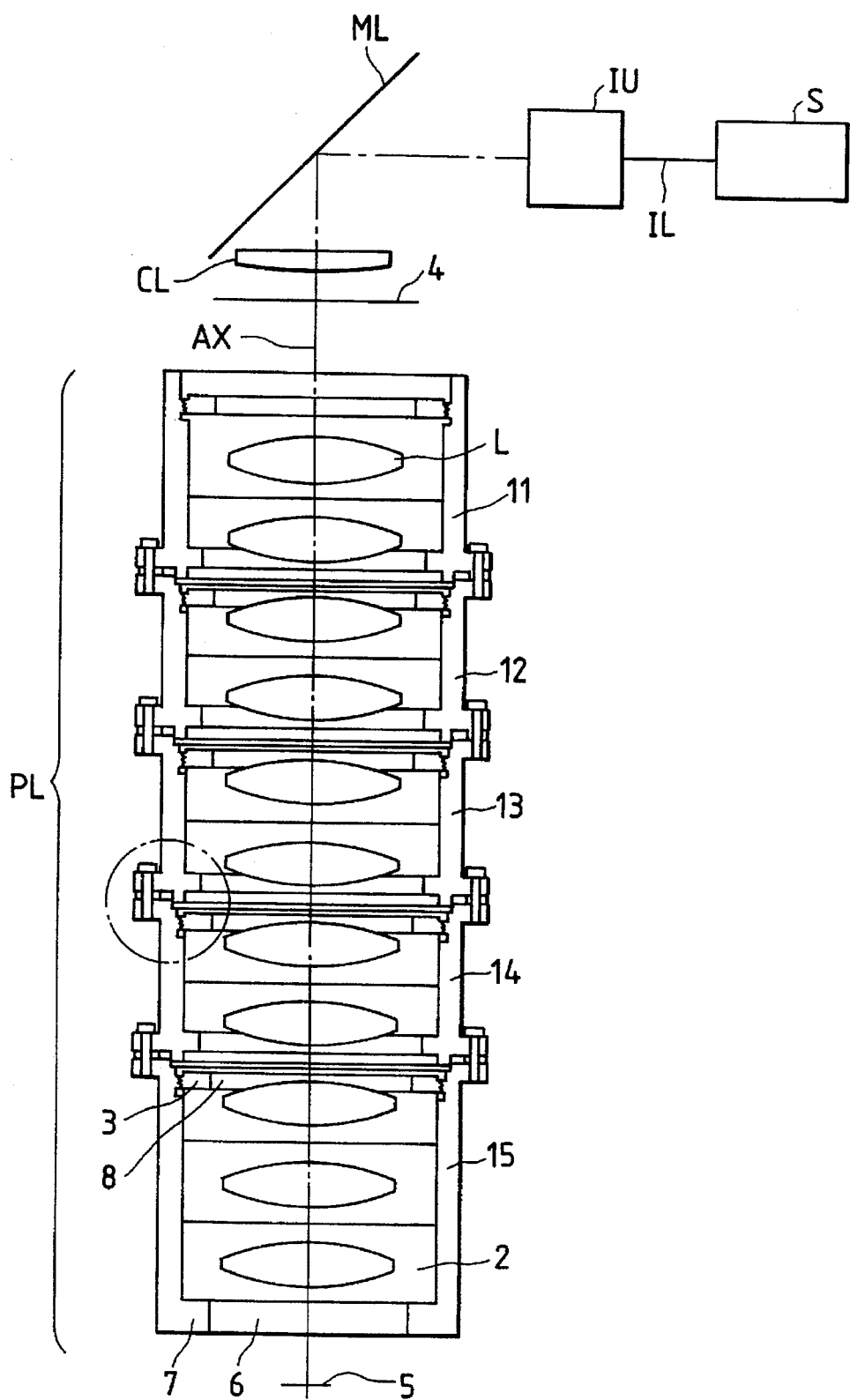
FIG. 1 is a view schematically illustrating a construction of a lens projection type projection optical system in accordance with a first embodiment of the present invention.

FIG. 1 is a view schematically illustrating a construction of a lens projection (refraction) type projection optical system in accordance with a first embodiment of the present invention. A light source (mercury lamp, excimer laser, etc.) S emits illumination light IL. The illumination light IL are incident on an illuminance uniformizing optical system IU inclusive of a fly-eye lens and the like. The illumination light IL from the illuminance uniformizing optical system IU are reflected by a mirror ML and condensed on a photomask 4 such as a reticle or the like by a condenser lens CL. The photomask 4 undergoes an illumination of light with a uniform illuminance by the illumination uniformizing optical system IU, the mirror ML and the condenser lens CL. Then, the light IL passing the photomask 4 are converged on a photosensitive substrate 5 such as a wafer through a projection optical system PL. The projection optical system PL, for instance, reduces a pattern formed on the photomask 4 down to, e.g., ⅕ and forms an image on the substrate 5.

Referring to again FIG. 1, the lens projection type projection optical system for transferring the pattern formed on the photomask 4 onto the substrate 5 like the wafer includes five lens barrel units 11, 12, 13, 14, 15. A bottom of each lens barrel unit is formed with an opening 6 and a protrusion member 7 protruding inward. An upper portion of each lens barrel unit is also formed with an opening into which a ring-like holding member 3 is fitted.

Further, each lens barrel unit incorporates a plurality of lens frames 2 for housing optical elements (lenses) L. In this embodiment, an optical axis of the lens housed in the lens frame 2 is located to coincide with an optical axis AX of the lens projection type projection optical axis.

Figure 2:
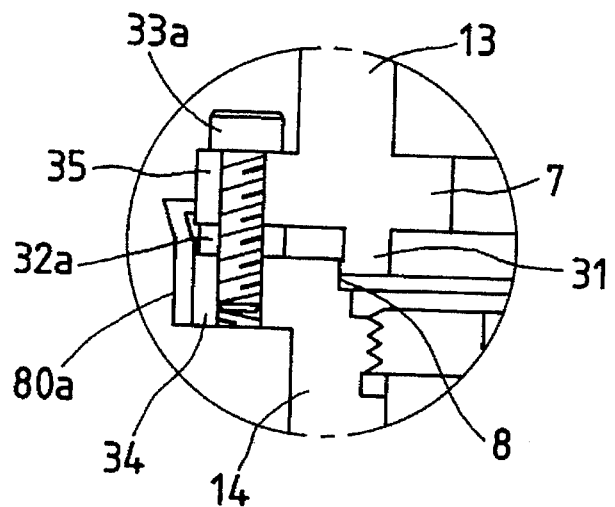
FIG. 2 is a sectional view showing a detail of a structure of connection between respective lens barrel units in the first embodiment.

FIG. 2 is a sectional view illustrating a detail of a structure of connection between the respective lens barrel units in the first embodiment. Referring to FIG. 2, a protrusion member 31 is formed to protrude downward from the bottom of an upper lens barrel unit 13. The protrusion member 31 is formed in a cylindrical shape and constructed to tightly fit into the opening 8 of a lower lens barrel unit 14. With this configuration, a quantity of eccentricity is normally restrained.

A lower annular flange 35 is formed at the bottom of the upper lens barrel unit 13, while an upper annular flange 34 is formed at the upper portion of the lower lens barrel unit 14. The lower flange 35 of the upper lens barrel unit 13 is connected via washers 32 (32a, 32b, 32c: only the wafer 32c is shown in FIG. 2) having a predetermined thickness to the upper flange 34 of the lower lens barrel unit 14 by use of a bolt 33 (33a, 33b, 33c: only the bolt 33a is illustrated in FIG. 2). It is desirable that each unit be bolt-connected at three points respectively, and, more preferably, the three pieces of bolts 33a to 33c are disposed in such positions as to substantially equally divide a circle with the optical axis AX being centered into three segments.

As illustrated in FIG. 1, the three intermediate lens barrel units 12 through 14 are so constructed as to make the above connections as described above at their upper and lower portions. The lens barrel units 11 and 15 are so constructed as to make the above-mentioned connections at the lower and upper portions, respectively.

Thus, by selecting the thicknesses of the washers 32a to 32c, the lens barrel unit 13 is made movable in directions along the optical axis AX with respect to the lens barrel unit 14. More specifically, the lens barrel 13 can be moved (hereinafter expressed such as shifted) in parallel along the optical axis AX with respect to the lens barrel 14 by use of the washers 32a to 32c each having the same thickness. At the same time, each lens barrel unit can be also tilted to the optical axis AX by changing the thickness of each of the washers 32a to 32c.

Thus, the washers 32 constitute a shift mechanism for shifting the lens barrel unit along the optical axis and a tilt mechanism for tilting the lens barrel unit to the optical axis.

On the other hand, in the discussion given above, the quantity of eccentricity is to be restrained. When adjusting an eccentricity of the optical axis of the lens barrel unit with respect to the optical axis AX, however, some allowance is given to the fitting state; and, for example, plate springs 80 are provided at the respective joined portions (three connected portions) of the respective lens barrel units and work to bias the respective lens barrel units toward the optical axis, thus adjusting the eccentricity. The respective joined portions are conceived as three pieces of connected portions, and, hence, the eccentricity is adjusted by the three plate springs 80a, 80b, 80c (only the plate spring 80a is illustrated in FIG. 2). The eccentricity is eliminated by equalizing the biasing forces of the individual plate springs. The biasing force of one plate spring (e.g., the plate spring 80a) among the three plate springs is set stronger than two other plate springs, thereby making it possible to give an eccentricity according to the biasing force.

Figure 3:
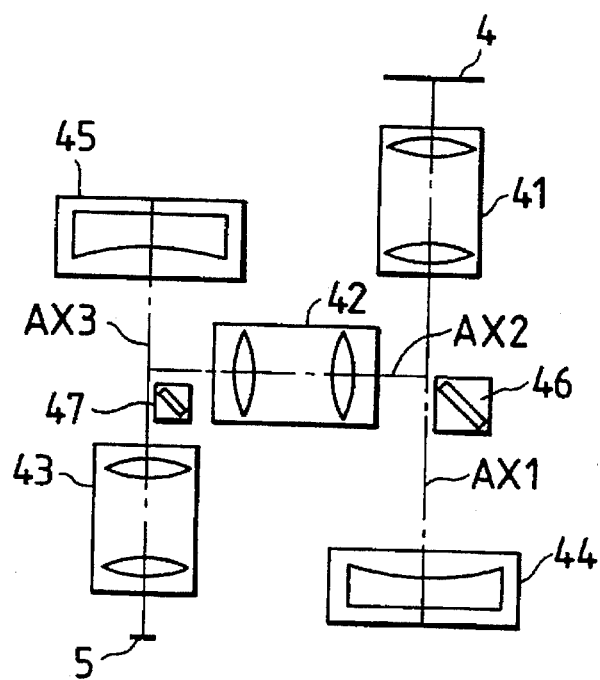
FIG. 3 is a view schematically showing a construction of a mirror-lens projection type projection optical system in a second embodiment of this invention.

FIG. 3 is a view schematically showing a construction of a mirror-lens projection (catadioptric system) type projection optical system in accordance with a second embodiment of the present invention. The light source S and the illumination optical system (IU, ML, CL) are the same as those of the apparatus of FIG. 1, and hence their illustrations are omitted in FIG. 3.

Turning to FIG. 3, the mirror-lens projection type projection optical system serves to transfer the pattern formed on the photomask 4 such as, e.g., a reticle onto the substrate like a wafer. This mirror-lens projection type projection optical system includes a first lens barrel unit 41 and a first spherical mirror 44 that are arranged along a first optical axis AX1. The first lens barrel unit 41 has, e.g., two optical elements but is disposed immediately under the reticle 4. Further, a first deflection mirror 46 is provided between the first lens barrel unit 41 and the first spherical mirror 44.

The mirror-lens projection type projection optical system in this embodiment further includes a second lens barrel unit 42 disposed along a second optical axis AX2. The second lens barrel unit 42 has, e.g., two pieces of optical elements but is located between the first deflection mirror 46 and a second deflection mirror 47.

The illustrated mirror-lens projection type projection optical system still further includes a third lens barrel unit and a second spherical mirror 45 that are arranged along a third optical axis AX3. The third lens barrel unit 43 has, e.g., two optical elements but is disposed above the wafer 5. Also, the second spherical mirror 45 is disposed in face-to-face relationship with the third lens barrel unit 43, with the second deflection mirror 47 being interposed therebetween.

Referring again to FIG. 3, the light rays passing the reticle 4 travel through the first lens barrel unit 41 and fall down on the first spherical mirror but are reflected upward therefrom. The light rays reflected from the first spherical mirror 44 are deflected toward a left horizontal direction in the Figure by the first deflection mirror 46 and enter the second lens barrel unit 42. Subsequently, the light rays passing the second lens barrel unit 42 are deflected upwards in the Figure by the second deflection mirror 47 and incident on the second spherical mirror 45. The light rays reflected downward in the Figure by the second spherical mirror 45 are image-formed on the wafer 5 via the third lens barrel unit 43. Thus, the pattern on the reticle 4 is transferred onto the wafer 5.

FIG. 4 is a view illustrating more specifically the construction of the mirror-lens projection type projection optical system of FIG. 3. FIG. 4 shows a state of how the above components 41, 42, 43, 44, 45, 46, 47 are attached to a body 48 of the mirror-lens projection type projection optical system but coincides with FIG. 3 in terms of the configuration.

Figure 5A:
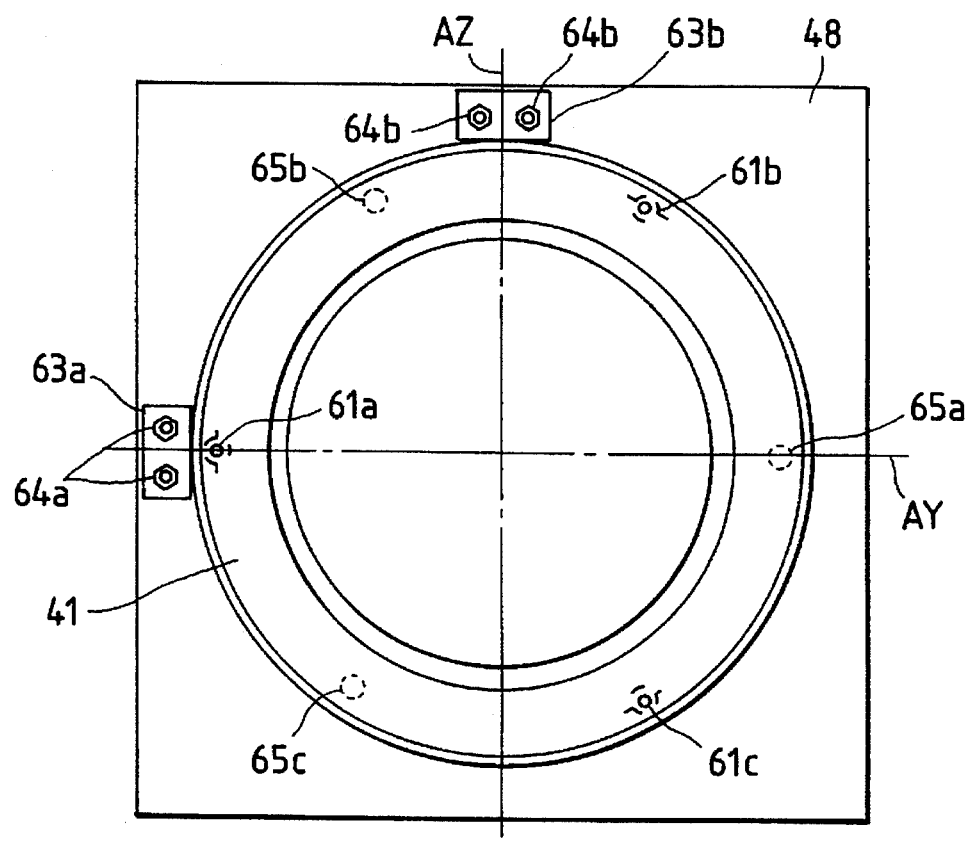
FIGS. 5A and 5B are views of assistance in explaining a locating/adjusting mechanism of a first lens barrel unit 41 of FIG. 3.
Figure 5B:
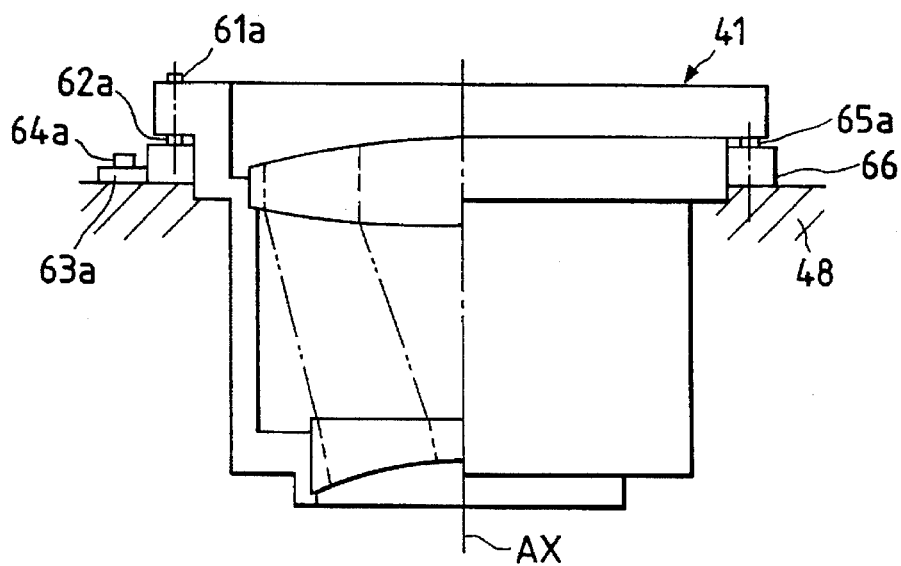

FIGS. 5A and 5B are views of assistance in explaining a locating/adjusting mechanism of a first lens barrel unit 41. FIG. 5A is a top view of the first lens barrel unit 41. FIG. 5B is a side partial sectional view showing of the first lens barrel unit 41.

Referring to FIGS. 5A and 5B, the first lens barrel unit 41 is fixed to a support member 66 through three pieces of bolts 61a, 61b, 61c and three pieces of washers 62a, 62b, 62c corresponding thereto. It is preferable that the bolts 61a to 61c be, as illustrated in the Figure, disposed to substantially equally divide a circle into three segments with the optical axis AX being centered.

The support member 66 is fixed to the body 48 of the projection optical system through the three bolts 65a, 65b, 65c. The three bolts 65a to 65c are also, as shown in the Figure, disposed to substantially equally divide the circle into the three segments with the optical axis being centered. Six pieces of bolts 61a to 61c and 65a to 65c are, as illustrated in the Figure, disposed to substantially equally divide the circle into six segments with the optical axis being centered.

Two pieces of contact members 63a and 63b are fixed to the body 48 of the projection optical system with two pairs of bolts 64a and 64b. More specifically, the two contact members 63a, 63b are disposed on two axial lines AY and AZ orthogonal to the optical axis AX.

The first lens barrel unit 41 shown in FIGS. 5A and 5B is constructed so that the contact members 63a, 63b are respectively movable along the AY- and AZ-directions by clearances of bolt-holes for the bolts 64a, 64b. Accordingly, the contact members 63a, 63b make contact with the first lens barrel unit 41 and are thus located. The first lens barrel unit 41 can be thereby located and adjusted in the directions orthogonal to the optical axis AX. In other words, the optical-axis eccentricity of the first lens barrel unit 41 can be adjusted.

Thus, the contact members 63a, 63b constitute the locating/adjusting mechanism for locating and adjusting the first lens barrel unit 41 in the direction orthogonal to the optical axis.

On the other hand, the lens barrel unit 41 can be shifted in the directions along the optical axis AX by selecting a thickness of each of the washers 62a to 62c. More specifically, the lens barrel unit 41 can be shifted along the optical axis AX by use of the washers 62a to 62c each having the same thickness. At the same time, the lens barrel unit 41 can be also tilted to the optical axis AX by changing the thickness of each of the washers 62a to 62c.

In this way, the washers 62a through 62c constitute the shift mechanism for shifting the first lens barrel unit 41 along the optical axis and the tilt mechanism for tilting the first lens barrel unit 41 to the optical axis.

Note that locating and adjusting mechanisms of the third lens barrel unit 43, the first spherical mirror 44 and the second spherical mirror 45 can be also similarly constructed.

Figure 6B:
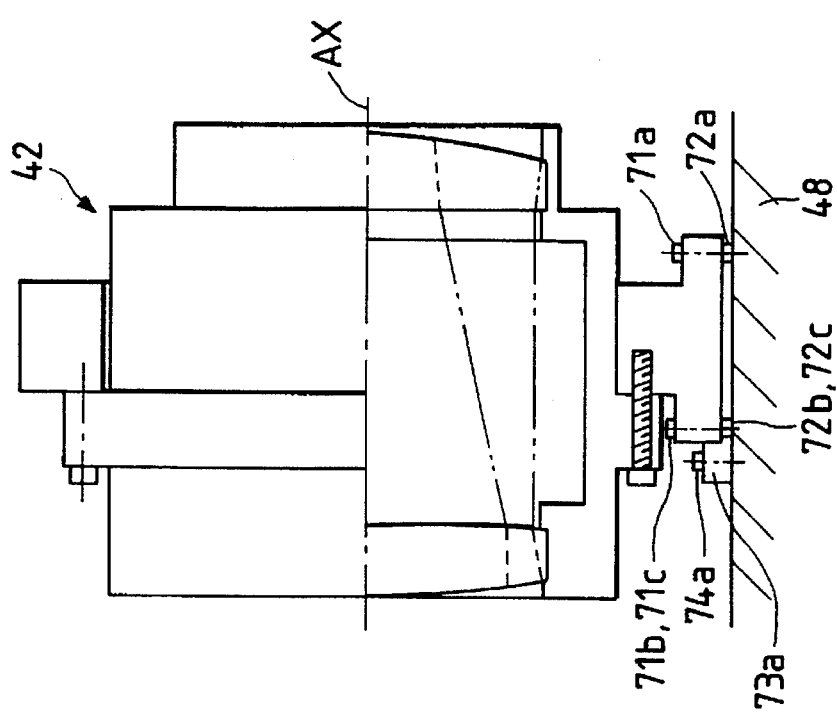
FIGS. 6A and 6B are views of assistance in explaining the locating/adjusting mechanism of a second lens barrel unit 42 of FIG. 3.
Figure 6A:
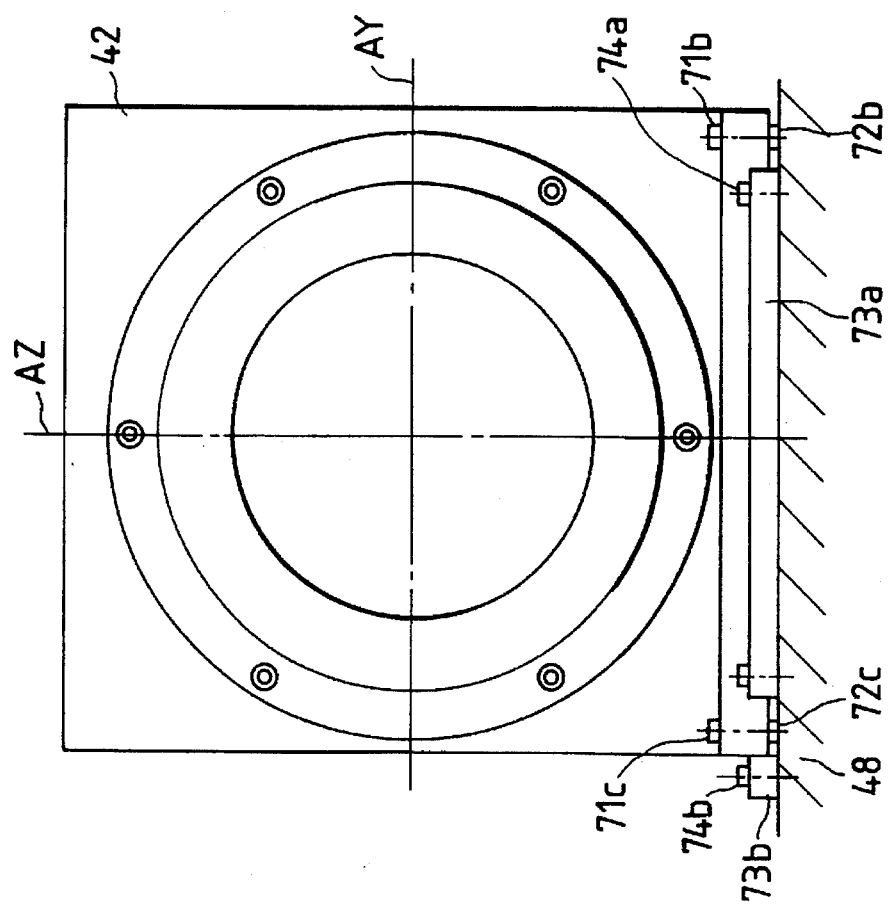
Figure 7:
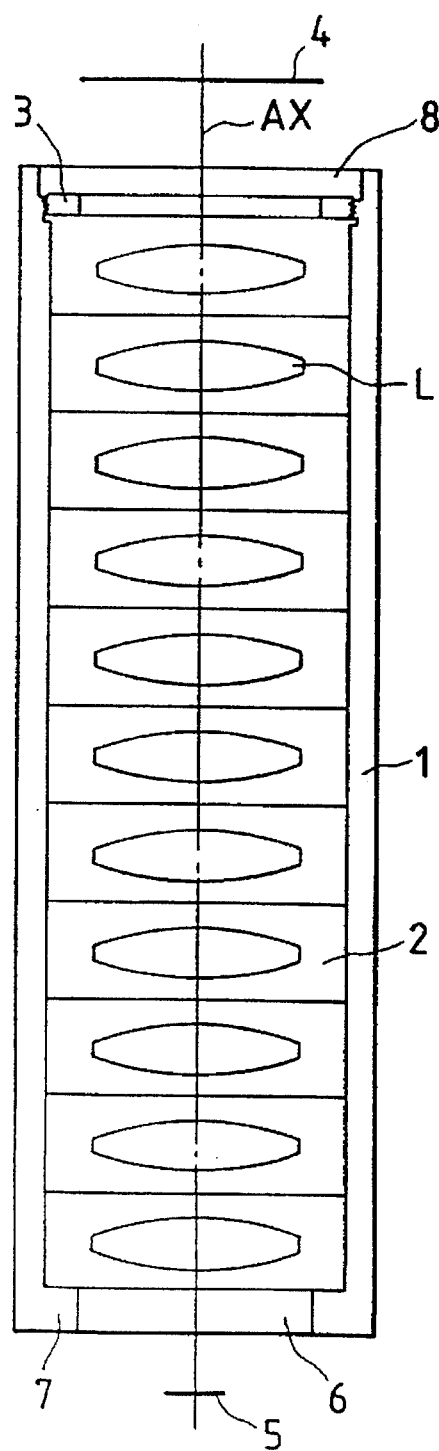
FIG. 7 is a view schematically illustrating a construction of a lens projection type projection optical system in the prior art.

FIGS. 6A and 6B are views of assistance in explaining the locating/adjusting mechanism of the second lens barrel unit 42. FIG. 6A is a front view of the second lens barrel unit 42. FIG. 6B is a side partial sectional view of the second lens barrel unit 42.

Referring to FIGS. 6A and 6B, the second lens barrel unit 42 is fixed to the body 48 of the projection optical system through the three bolts 71a, 71b, 71c and three washers 72a to 72c corresponding thereto. It is preferable that the bolts 71a to 71c be disposed at equiangular intervals (evenly disposed to substantially equally divide a given circle into three segments).

Two contact members 73a and 73b are fixed to the body 48 of the projection optical system by use of two pairs of bolts 74a and 74b. More specifically, the contact member 73a extends perpendicularly to a plane including the optical axis AX and the axial line AZ. The contact member 73b extends in parallel to the plane including the optical axis AX and the axial line AZ.

The second lens barrel unit 42 of FIGS. 6A and 6B is constructed so that the contact members 73a, 73b are respectively movable along the optical-axis AX-direction and the AY-direction by clearances of bolt-holes for the bolts 74a, 74b. Accordingly, the contact member 73a makes contact with the second lens barrel unit 42 and is thus located. With this operation, the second lens barrel unit 42 is shifted in the optical-axis AX-direction and can be thus locating-adjusted. Further, the contact member 73b is brought into contact with the second lens barrel unit 42 and is thus located. With this operation, the second lens barrel unit 42 can be locating-adjusted in the axial-line AY-direction orthogonal to the optical axis AX.

On the other hand, the lens barrel unit 42 is shifted in the axial-line AZ-direction orthogonal to the optical axis or tilted to the optical axis AX by selecting a thickness of each of the washers 72a through 72c. More specifically, the lens barrel unit 42 can be shifted along the axial line AZ orthogonal to the optical axis AX by use of the washers 72a through 72c each having the same thickness. At the same time, the lens barrel unit 42 can be also tilted to the optical axis AX by changing the thickness of each of the washers 72a to 72c.

Thus, the contact member 73a constitutes a shift mechanism for shifting the second lens barrel unit 42 along the optical axis, while the contact member 73b constitutes a locating/adjusting mechanism for locating and adjusting the second lens barrel unit 42 in the directions orthogonal to the optical axis.

Further, the washers 72a to 72c constitute the locating/adjusting mechanism for locating and adjusting the second lens barrel unit 42 in the directions orthogonal to the optical axis and the tilt mechanism for tilting the second lens barrel unit 42 to the optical axis.

Note that locating/adjusting mechanisms of the first deflection mirror 46 and the second deflection mirror 47 can be also likewise constructed.

Further, when each of the lens barrel units 41, 42, 43 in the second embodiment is composed of a plurality (e.g., 11 pieces) of optical elements, as in the first embodiment, ten pieces of optical elements are separated, and, thus, the respective lens barrel units may be separation lens barrel units. With this arrangement, it is possible to make the optical adjustment of only a desired optical element unit with respect to the individual lens barrel units 41, 42, 43.

Note that the first embodiment discussed above has presented the example where the shift mechanism and the tilt mechanism involve the use of washers, and the eccentricity correcting mechanism involve the use of plate springs. However, separate proper members can be also employed for the respective mechanisms without departing from the scope of the present invention. As disclosed in, e.g., U.S. Pat. No. 5,117,255, the lens barrel unit may be driven (shifted, tilted and made eccentric) by use of piezo elements.

The lens barrel unit may be driven by a microhead drive, a motor drive and a hydraulic jack drive.

Further, in the above-discussed first embodiment, the upper lens barrel unit is connected to the lower lens barrel unit by fastening the bolts. It is, however, apparent that the connection therebetween may involve the use of other proper connecting methods and members such as a vacuum adsorption, an electromagnet and so on.

Further, in the first embodiment discussed above, the upper and lower adjacent units are constructed to restrain the eccentric quantity in such a manner that the cylindrical protrusion member is fitted tightly into the opening or to adjust the eccentricity by the parallel shift mechanism using plate springs. There may be, however, taken such as construction as to adjust the eccentricity by a contact member like a V-block or the like.

The above-described shift mechanism, the tilt mechanism and the eccentric mechanism (washers, piezo elements and plate springs) in the first and second embodiments may be constructed to drive each lens barrel unit in order to change a focal position, a magnification and an aberration such as a distortion or the like.

For example, the mechanism for moving the lens barrel with piezoelectricity and a mechanism for driving a lens element which is described in U.S. Pat. No. 5,117,255 are the same.

Further, in both of the first embodiment and the second embodiment, an inter-unit air pressure can be varied simply by adding a hermetic mechanism and a pressure control mechanism as disclosed in U.S. Pat. No. 4,666,273 to the connection between the lens barrel units. If the hermetic mechanism and a temperature control mechanism are provided, a temperature can be also controlled. This makes it possible to change optical characteristics, such as a magnification and the like, of the projection optical system. The hermetic mechanism involves the use of, e.g., an O-ring in the fitting portion in the case of the first embodiment but, in the second embodiment, further adds a hermetic block.

As discussed above, the lens barrel is separated into a plurality of replaceable lens barrel units, and, therefore, when effecting the optical adjustment per separated unit by employing, e.g., a master, it is possible to independently perform the optical adjustment of a desired unit at a high efficiency without exerting an influence on the whole projection optical system or other units. Accordingly, time required for the optical adjustment is remarkably reduced.

Further, the units are replaceable, and hence, when some trouble is caused in a certain unit, this unit can be replaced with a unit exhibiting the same optical characteristic or a different optical characteristic as the necessity arises. Therefore, working burden is decreased, and, at the same time, maintainability is improved. In addition, reliability of the projection optical system and further of the projection type exposure apparatus is outstandingly improved.

Moreover, since optical performance of each unit can be evaluated beforehand, a projection optical system exhibiting excellent optical performance on the whole by such a combination of units can be provided so as to compensate for a lack of optical performance of each unit.

It is apparent that, in this invention, a wide range of different working modes can be formed based on the invention without deviating from the spirit and scope of the invention. This invention is not restricted by its specific working modes except being limited by the appended claims.

What is claimed is:

1. A projection type exposure apparatus for illuminating a mask formed with a pattern with an illumination light having a predetermined wavelength area region and forming an image of the pattern on a substrate through a projection optical system, said apparatus comprising:

a projection optical system incorporating a plurality of lens barrel units each housing one or more optical elements, wherein each of said lens barrel units is so mounted in said projection optical system as to be individually attachable thereto and detachable therefrom, and each of said lens barrel units has an adjustment mechanism that adjusts the position of an optical element housed therein.

2. A projection type exposure apparatus according to claim 1, further comprising a pressure adjusting mechanism for adjusting pressure of air between said optical elements.

3. A projection type exposure apparatus according to claim 2, wherein said pressure adjusting mechanism adjusts pressure of air between said lens barrel units.

4. A projection type exposure apparatus according to claim 1, wherein said projection optical system is a projection lens system.

5. A projection type exposure apparatus according to claim 1, wherein said projection optical system is a system comprising mirror and lens components.

6. A projection type exposure apparatus according to claim 5, wherein at least one of said lens barrel units includes a concave mirror.

7. A projection type exposure apparatus according to claim 1, further comprising:

a cylindrical protrusion member protruding downwardly from a bottom of one of said lens barrel units; and an upwardly disposed opening in another of said lens barrel units, wherein said protrusion member is constructed to fit into said opening.

8. A projection type exposure apparatus for illuminating a mask formed with a pattern with illumination light having a predetermined wavelength region and forming an image of the pattern on a substrate through a projection optical system, said apparatus comprising:

a projection optical system incorporating a plurality of lens barrel units each housing one or more optical elements, wherein each of said lens barrel units is so mounted in said projection optical system as to be attachable thereto and detachable therefrom, and wherein at least two of said lens barrel units are selected so as to compensate for lack of optical performance of respective optical elements with respect to a desired optical characteristic for forming said image of the pattern on said substrate, and wherein each of said lens barrel units has an adjusting system which locates each of said lens barrel units in a predetermined position in said projection optical system, and wherein said adjusting system makes at least one of a shift adjustment of each of said lens barrel units along an optical axis of said projection optical system, a movement adjustment of each of said lens barrel units in a plane perpendicular to said optical axis, and a tilt adjustment of each of said lens barrel units with respect to said optical axis, and wherein each of said lens barrel units is individually adjusted.

9. A projection type exposure apparatus according to claim 8, wherein said projection optical system is a projection lens system.

10. A projection type exposure apparatus according to claim 8, wherein said projection optical system is a system comprising mirror and lens components.

11. A projection type exposure apparatus according to claim 10, wherein at least one of said lens barrel units includes a concave mirror.

12. A projection type exposure apparatus for illuminating a mask formed with a pattern with illumination light having a predetermined wavelength region and forming an image of the pattern on a substrate through a projection optical system, said apparatus comprising:

a projection optical system incorporating a plurality of lens barrel units each housing one or more optical elements, wherein each of said lens barrel units is so mounted in said projection optical system as to be attachable thereto and detachable therefrom, and wherein at least two of said lens barrel units are selected so as to compensate for lack of optical performance of respective optical elements with respect to a desired optical characteristic for forming said image of the pattern on said substrate;

said projection type exposure apparatus further comprising a pressure adjusting mechanism for adjusting pressure of air between said optical elements, and wherein said pressure adjusting mechanism adjusts pressure of air between said lens barrel units.

13. A method of providing a projection optical system comprising:

providing a plurality of separate lens barrel units each having a housing containing at least one optical element;

arranging said lens barrel units in sequence along a common optical axis;

attaching the housing of each lens barrel unit to a housing of an adjacent lens barrel unit so that the lens barrel units form a substantially continuous projection optical system;

determining optical performance deficiencies of said projection optical system; and replacing one or more lens barrel units of said projection optical system with different or modified lens barrel units, by detachment of individual lens barrel units from said projection optical system and attachment of individual lens barrel units to said projection optical system, in order to reduce said deficiencies.

14. A method according to claim 13, further comprising adjusting positions of one or more optical elements of said lens barrel units of said projection optical system to improve the optical performance of said projection optical system.

15. A method according to claim 13 further comprising adjusting air pressure between optical elements of said projection optical system to improve the optical performance of said projection optical system.

* * * * *